(12) United States Patent
Shi et al.

(10) Patent No.: US 11,178,785 B2
(45) Date of Patent: Nov. 16, 2021

(54) METAL ENCLOSURE OF MOBILE DEVICE, PRODUCTION METHOD FOR METAL ENCLOSURE, AND MOBILE DEVICE

(71) Applicant: HUAWEI TECHNOLOGIES CO., LTD., Guangdong (CN)

(72) Inventors: Wenming Shi, Shenzhen (CN); Wangchun Lv, Shenzhen (CN); Yongxiang Wang, Shenzhen (CN); Kaiwen Huang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 225 days.

(21) Appl. No.: 16/366,726

(22) Filed: Mar. 27, 2019

(65) Prior Publication Data

US 2019/0223311 A1    Jul. 18, 2019

Related U.S. Application Data

(63) Continuation of application No. PCT/CN2017/086631, filed on May 31, 2017.

(30) Foreign Application Priority Data

Sep. 28, 2016    (CN) .......................... 201610867934.4

(51) Int. Cl.
*H01Q 1/27*        (2006.01)
*H05K 5/04*        (2006.01)
(Continued)

(52) U.S. Cl.
CPC .............. *H05K 5/04* (2013.01); *G02B 6/0031* (2013.01); *H01Q 1/243* (2013.01); *H01Q 1/273* (2013.01);
(Continued)

(58) Field of Classification Search
CPC .......... H05K 5/04; H05K 5/0086; H05K 5/03; H01Q 1/273; H04M 1/02
See application file for complete search history.

(56) References Cited

U.S. PATENT DOCUMENTS 7,045,220 B2    5/2006  Ishiduka et al.
9,362,972 B2 *  6/2016  Johnson .............. H04M 1/0206
(Continued)

FOREIGN PATENT DOCUMENTS

CN        101366147 B    10/2012
CN        104377424 A     2/2015
(Continued)

OTHER PUBLICATIONS

International Search Report and Written Opinion issued in International Application No. PCT/CN2017/086631 dated Aug. 23, 2017, 22 pages.
(Continued)

*Primary Examiner* — Graham P Smith
*Assistant Examiner* — Jae K Kim
(74) *Attorney, Agent, or Firm* — Fish & Richardson P.C.

(57) ABSTRACT

A metal enclosure of a mobile device, a production method for the metal enclosure, and a mobile device are disclosed. The metal enclosure of a mobile device includes a housing, where at least one gap is disposed on the housing, and the at least one gap divides the housing into at least two electrically insulated parts. The metal enclosure further includes an insulation film attached to a surface of the housing. In the foregoing embodiments, the gap is provided on the housing, so that the housing is divided into the at least two electrically insulated parts. Each gap is filled with an insulation object, and the gap on the surface of the housing and the insulation object in the gap form a partition.

6 Claims, 13 Drawing Sheets

(51) Int. Cl.
| | |
|---|---|
| *H05K 5/00* | (2006.01) |
| *H05K 5/03* | (2006.01) |
| *H04M 1/02* | (2006.01) |
| *F21V 8/00* | (2006.01) |
| *H01Q 1/52* | (2006.01) |
| *H01Q 1/24* | (2006.01) |

(52) U.S. Cl.
CPC .............. *H01Q 1/526* (2013.01); *H04M 1/02* (2013.01); *H04M 1/026* (2013.01); *H04M 1/0249* (2013.01); *H04M 1/0283* (2013.01); *H05K 5/0086* (2013.01); *H05K 5/03* (2013.01)

(56) References Cited

U.S. PATENT DOCUMENTS

| | | | | |
|---|---|---|---|---|
| 9,941,581 | B2* | 4/2018 | Ely | ........................ H01Q 1/24 |
| 10,321,590 | B2* | 6/2019 | Cater | ................. H04M 1/0249 |
| 2009/0153416 | A1 | 6/2009 | Arbin et al. | |
| 2010/0291361 | A1 | 11/2010 | Hsu et al. | |
| 2011/0230937 | A1 | 9/2011 | Boutaud et al. | |
| 2014/0020949 | A1 | 1/2014 | Boutaud et al. | |
| 2014/0284096 | A1* | 9/2014 | Wu | ......................... H05K 5/04 174/520 |
| 2016/0192456 | A1 | 6/2016 | Su et al. | |
| 2017/0019510 | A1 | 1/2017 | Jeon et al. | |
| 2017/0149118 | A1* | 5/2017 | Wang | .................... H01Q 1/243 |
| 2017/0288720 | A1 | 10/2017 | Jiang et al. | |
| 2017/0297242 | A1 | 10/2017 | Li et al. | |

FOREIGN PATENT DOCUMENTS

| | | | | |
|---|---|---|---|---|
| CN | 104735941 | A | | 6/2015 |
| CN | 104735942 | A * | 6/2015 | ............... H05K 5/04 |
| CN | 104735942 | A | | 6/2015 |
| CN | 105322290 | A | | 2/2016 |
| CN | 105517389 | A | | 4/2016 |
| CN | 105530783 | A | | 4/2016 |
| CN | 105530786 | A | | 4/2016 |
| CN | 105530788 | A | | 4/2016 |
| CN | 105530791 | A | | 4/2016 |
| CN | 105744015 | A | | 7/2016 |
| CN | 105960131 | A | | 9/2016 |
| EP | 2377573 | B1 | | 5/2012 |
| JP | 2009090639 | A | | 4/2009 |
| JP | 2009213788 | A | | 9/2009 |
| JP | 2015162672 | A | | 9/2015 |
| JP | 2015533194 | A | | 11/2015 |
| KR | 20100023804 | A | | 3/2010 |

OTHER PUBLICATIONS

Chinese Office Action issued in Chinese Application No. 201610867934.4 dated Mar. 5, 2019, 9 pages.
Anderson et al., "Thin Films for Advanced Glazing Applications" Buildings 6.3, Sep. 6, 2016, total 34 pages.
Extended European Search Report issued in application No. 17854451.6, dated Jun. 11, 2019, 13 pages.
Beijing Aeronautical Materials Research Institute, "Aviation material technology", Publishing: Beijing: Aviation Industry Press, Retrieved from : URL <https://book.duxiu.com/bookDetail.jsp?dxNumber= 000013762796andd= 192D28615695F31F44AE8F18E5A2540Dandfenlei=200206andsw=% E8%88%AA%E7%A9%BA%E6%9D%90%E6%96%99%E6%8A% 80%E6%9C%AF>,Dec. 2013, 1 page (English Abstract Only).
Office Action issued in Chinese Application No. 201610867934.4 dated Oct. 16, 2019, 8 pages.
Office Action issued in Korean Application No. 2019-7007479 dated Aug. 19, 2020, 16 pages (with English translation).
Office Action issued in Japanese Application No. 2019-510611 dated Jun. 30, 2020, 24 pages (with English translation).

* cited by examiner

FIG. 2.1
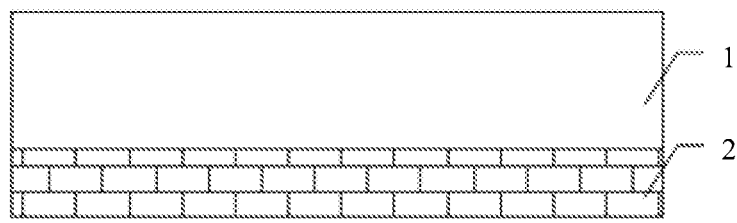
FIG. 2.2
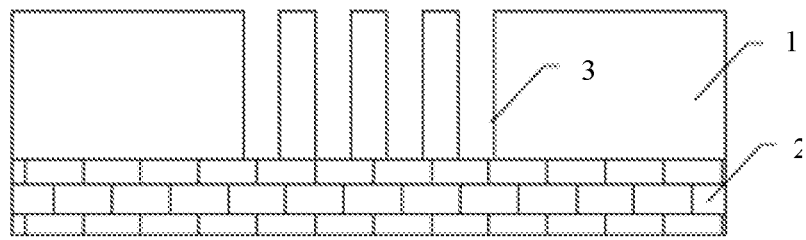
FIG. 2.3
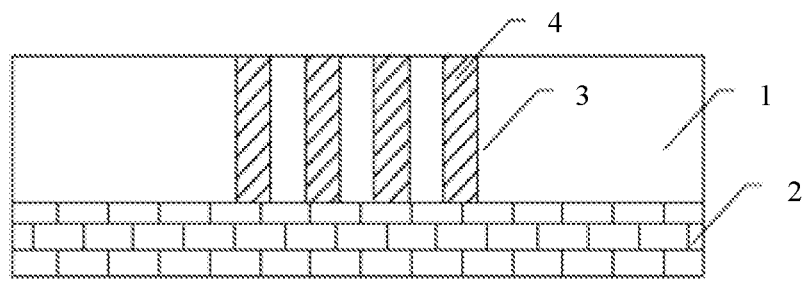
FIG. 2.4

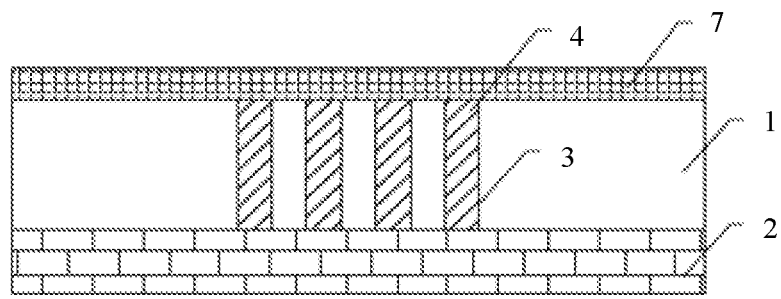
FIG. 2.5
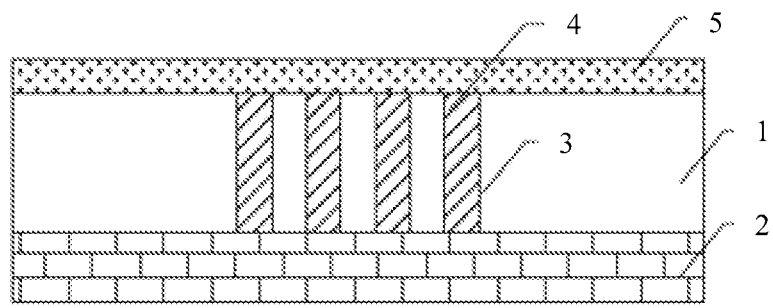
FIG. 2.6
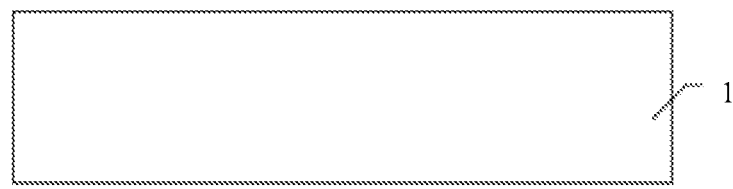
FIG. 2.7

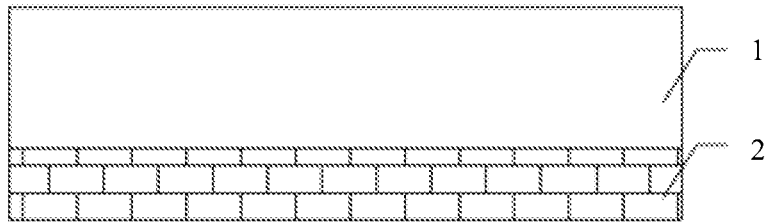
FIG. 2.8
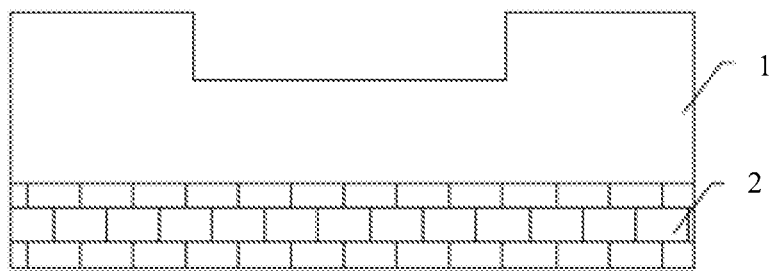
FIG. 2.9
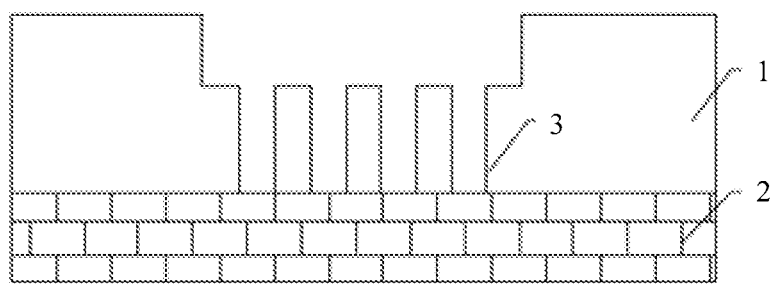
FIG. 2.10
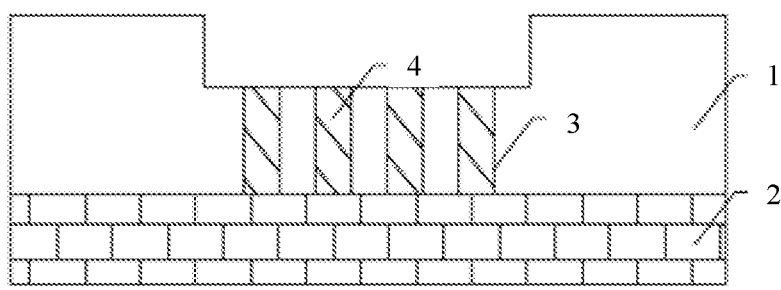
FIG. 2.11

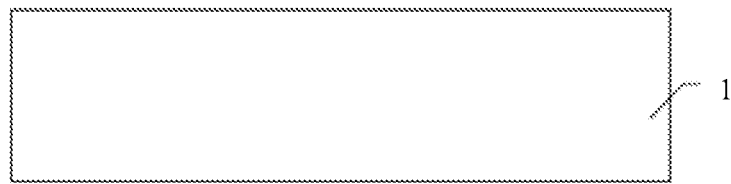
FIG. 3.1
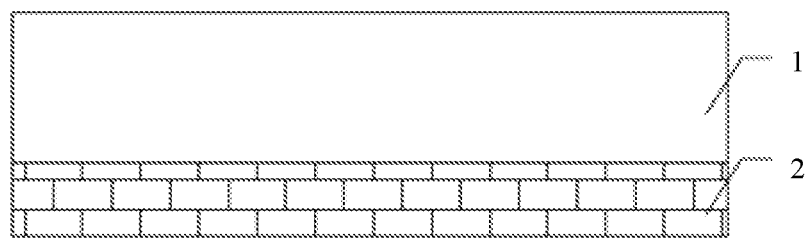
FIG. 3.2
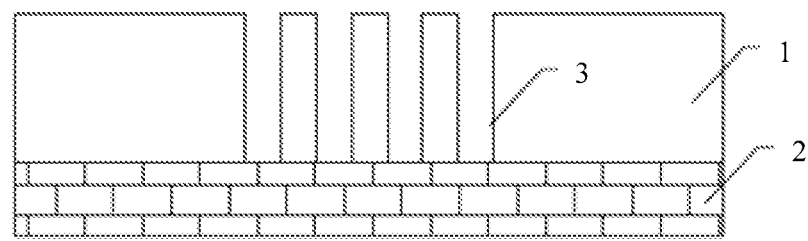
FIG. 3.3
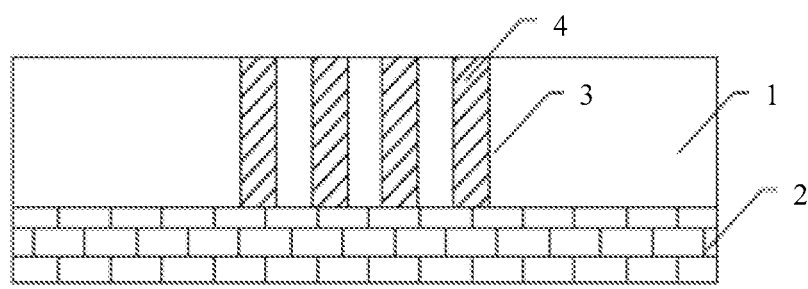
FIG. 3.4

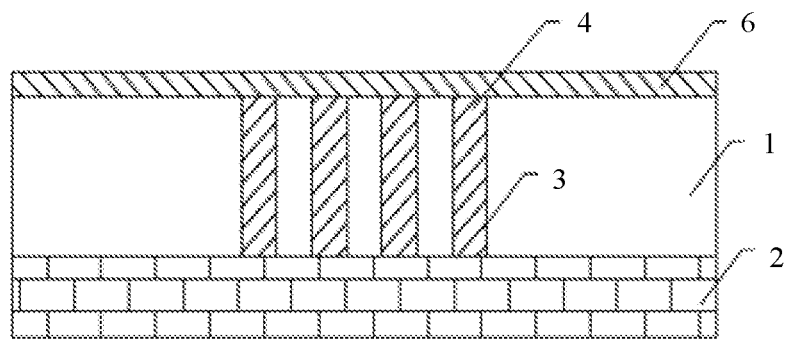
FIG. 3.5
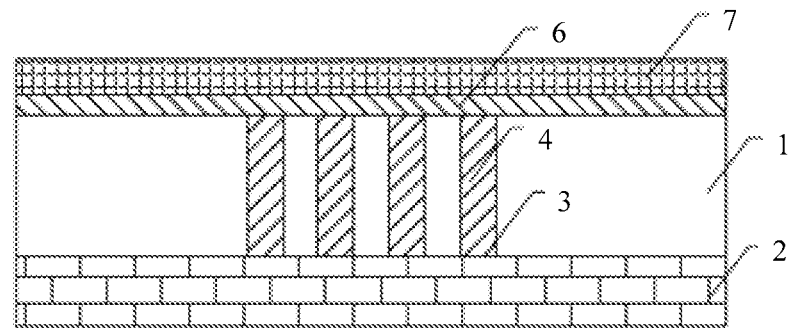
FIG. 3.6
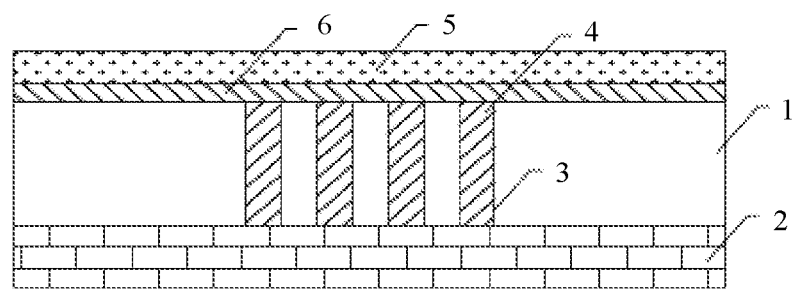
FIG. 3.7

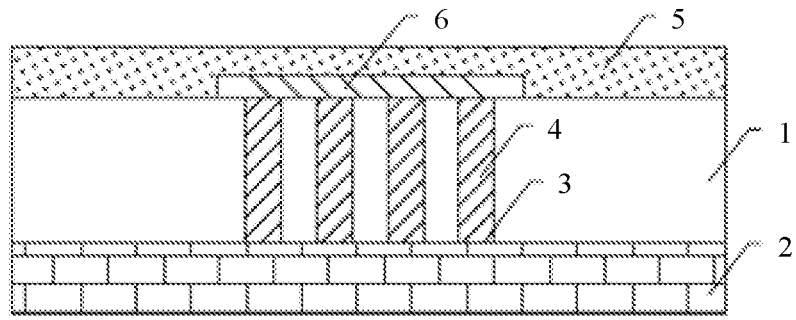
FIG. 4
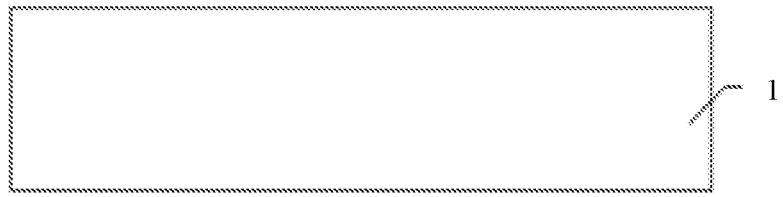
FIG. 4.1
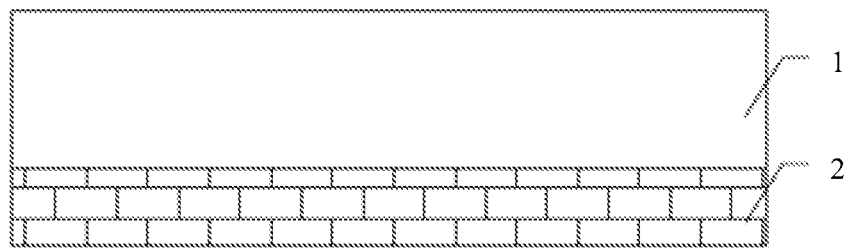
FIG. 4.2
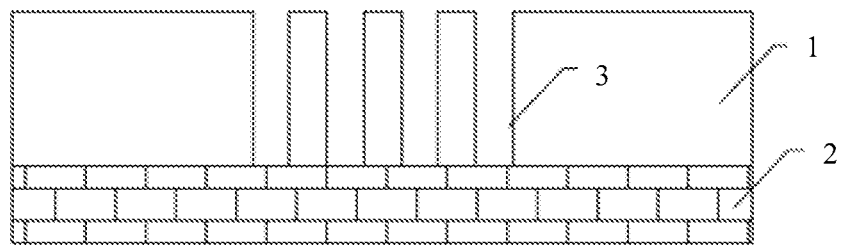
FIG. 4.3

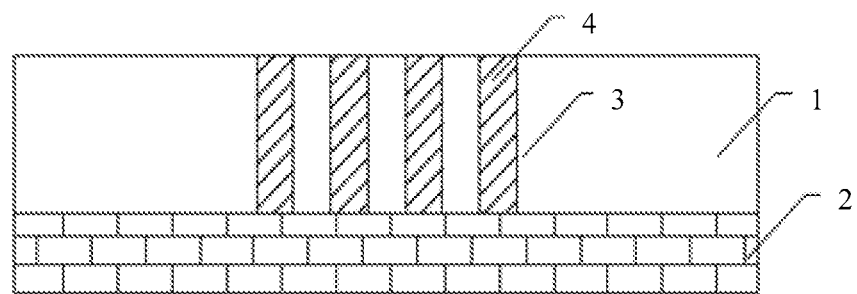
FIG. 4.4
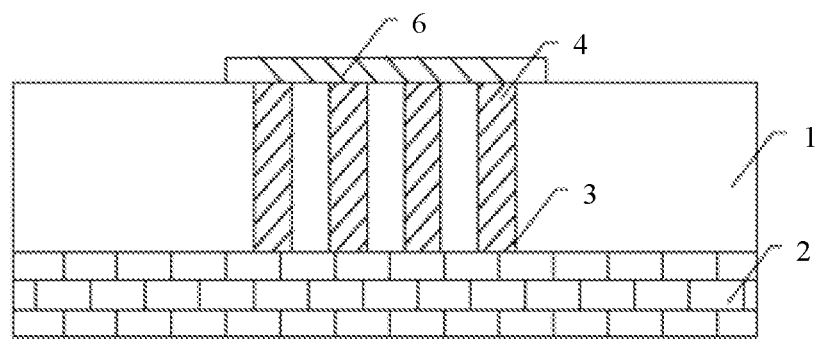
FIG. 4.5
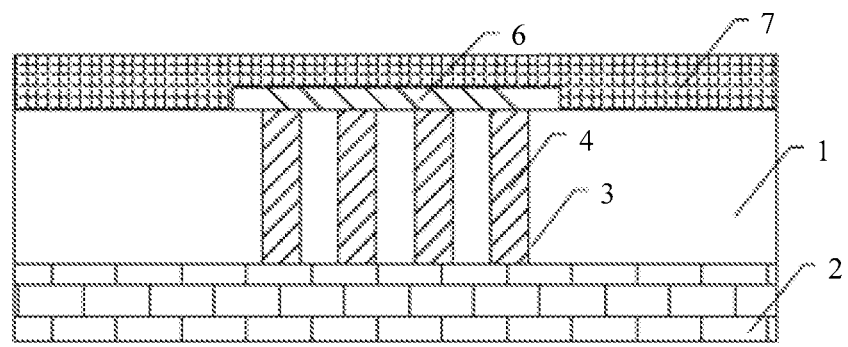
FIG. 4.6

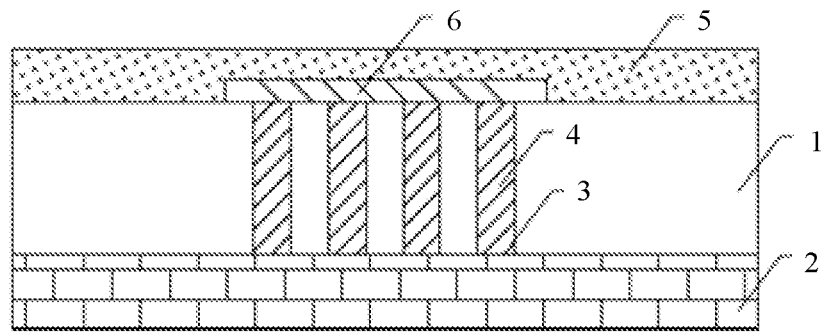
FIG. 4.7
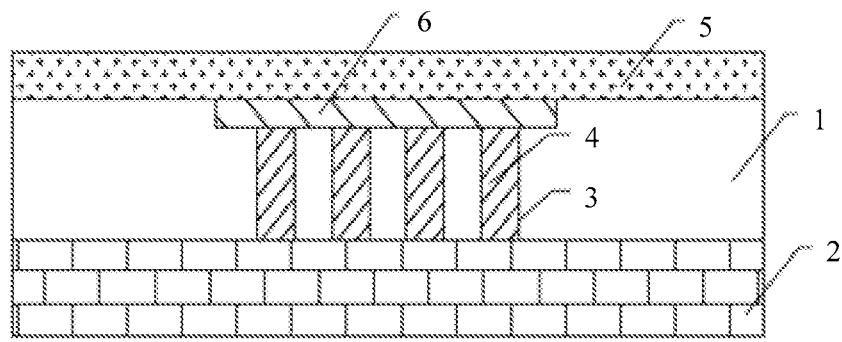
FIG. 5
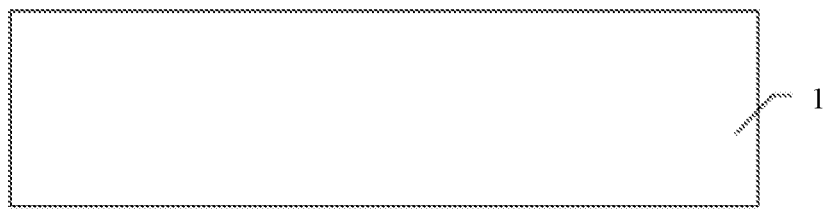
FIG. 5.1

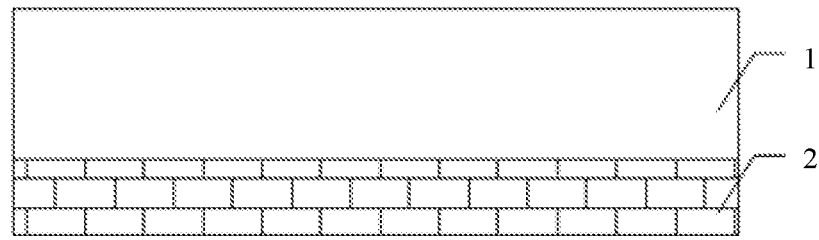
FIG. 5.2
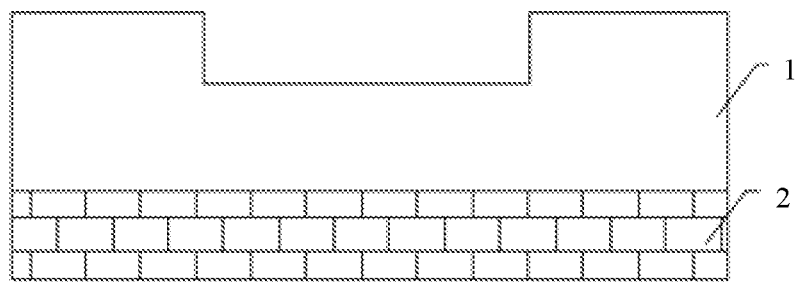
FIG. 5.3
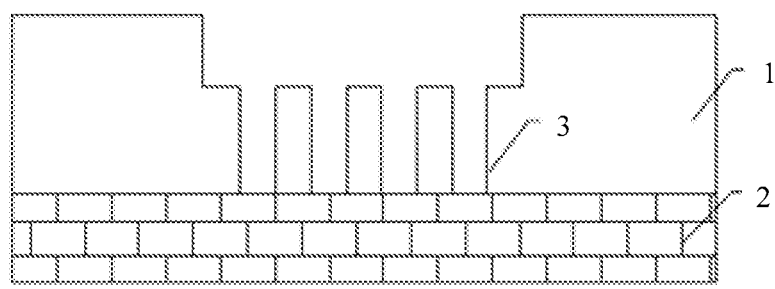
FIG. 5.4

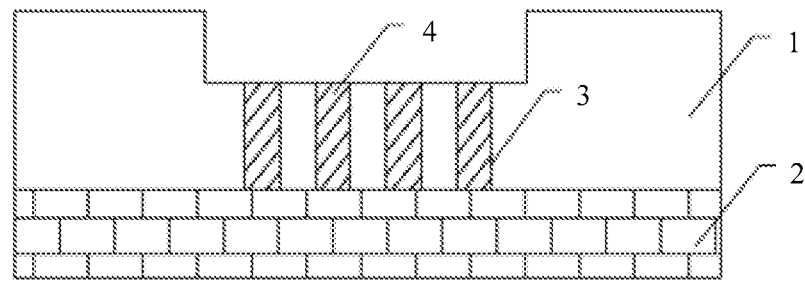
FIG. 5.5
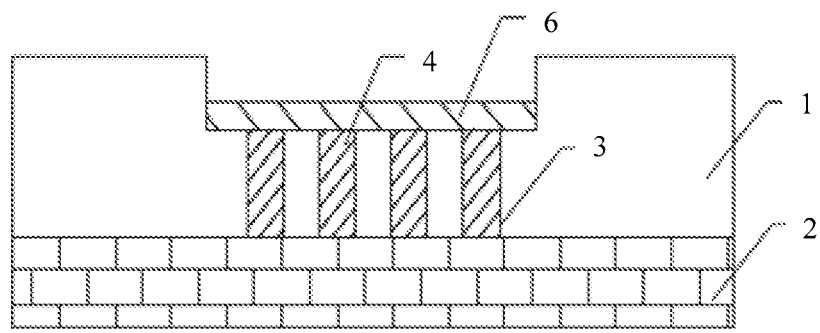
FIG. 5.6
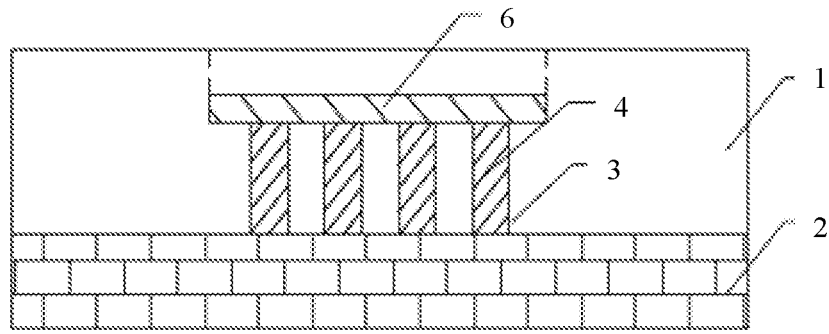
FIG. 5.7

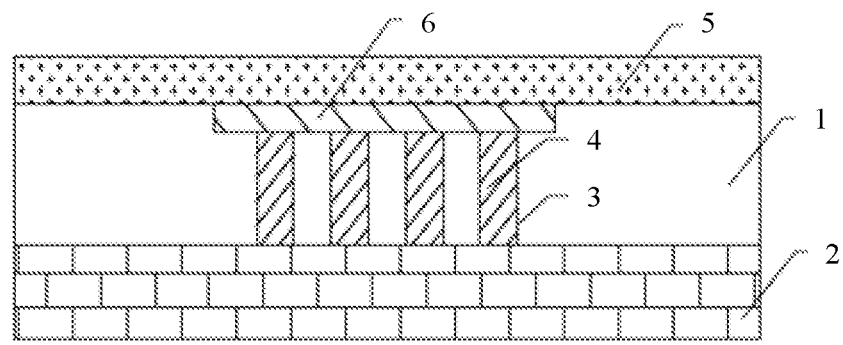
FIG. 5.8

METAL ENCLOSURE OF MOBILE DEVICE, PRODUCTION METHOD FOR METAL ENCLOSURE, AND MOBILE DEVICE

CROSS-REFERENCE TO RELATED APPLICATIONS

This application is a continuation of International Application No. PCT/CN2017/086631, filed on May 31, 2017, which claims priority to Chinese Patent Application No. 201610867934.4, filed on Sep. 28, 2016. The disclosures of the aforementioned applications are hereby incorporated by reference in their entireties.

TECHNICAL FIELD

This application relates to the field of electronic devices, and in particular, to a metal enclosure of a mobile device, a production method for the metal enclosure, and a mobile device.

BACKGROUND

Currently, metal materials are widely used as outer housings of various types of electronic devices. Unlike a conventional plastic housing, a metal enclosure has obvious advantages in terms of structural strength, heat dissipation performance, appearance quality, and the like. A variety of electronic products (such as a smartphone, a smartwatch, and a tablet computer) usually have a communications function, and therefore, when a metal enclosure is selected for such an electronic product, electromagnetic wave shielding performance of a metal material needs to be considered, and impact exerted on the communications function by the metal enclosure needs to be considered too. A smartphone is used an example. Currently, for a mobile phone with a metal enclosure, a groove usually needs to be provided on the metal enclosure to form a partition, to ensure that an antenna signal can pass through. To ensure integrity of the metal enclosure, an antenna groove partition is filled with nonmetal. Consequently, the metal enclosure is divided into two segments, three segments, or even more segments by the nonmetal, and appearance integrity of the metal enclosure is affected.

SUMMARY

The present invention provides a metal enclosure of a mobile device, a production method for the metal enclosure, and a mobile device. The metal enclosure of a mobile device has an integrated appearance, and an electromagnetic wave is not shielded, so that a communications function of the mobile device is ensured.

The present invention provides a metal enclosure of a mobile device. The metal enclosure of a mobile device includes a housing, where at least one gap is provided on the housing, the at least one gap divides the housing into at least two electrically insulated parts, and each gap is filled with an insulation object; and further includes an insulation film attached to a surface of the housing.

In the foregoing embodiment, the gap is provided on the housing, so that the housing is divided into the at least two electrically insulated parts. Each gap is filled with the insulation object, and the gap on the surface of the housing and the insulation object in the gap form a partition, so that impact exerted on electromagnetic wave transmission by electromagnetic shielding generated by the housing is avoided, and a communications function of the mobile device is ensured. The insulation film is further on the surface of the housing, and the insulation film covers the gap on the surface of the housing, so that the gap is invisible in appearance, and the metal enclosure has an integrated appearance.

In a specific implementation solution, the insulation film is a metal oxide film. The metal oxide film covers the gap part, so that the metal enclosure has an integrated appearance and has metallic luster, and texture of the metal enclosure is improved.

In an option, a width of each gap falls within a range from 0.01 mm to 2.0 mm, such as 0.01 mm, 0.05 mm, 0.1 mm, 0.3 mm, 0.5 mm, 1.0 mm, and 2.0 mm.

In an option, a thickness of the insulation film falls within a range from 0.003 mm to 0.10 mm, such as 0.01 mm, 0.03 mm, 0.05 mm, and 0.08 mm.

To increase strength of the metal enclosure and further improve a cavity structure of the metal enclosure, the metal enclosure further includes a plastic reinforcement layer fastened to a cavity of the housing.

In another specific implementation solution, the metal enclosure further includes a reflective film between the housing and the insulation film, and the reflective film covers the entire surface of the housing.

In an option, the metal enclosure further includes a reflective film between the housing and the insulation film, the reflective film covers a surface of the at least one gap, and when two or more gaps are provided on the housing, the reflective film further covers an area between neighboring gaps in the two or more gaps.

In an option, the metal enclosure further includes a groove located on the surface of the housing, the at least one gap is provided on a bottom wall of the groove, and a reflective film covering the bottom wall of the groove is further in the groove.

In an option, the reflective film is an imitated metal coating.

In an option, the reflective film may further be made from indium, tin, or an indium-tin alloy by means of deposition. The reflective film may adjust an appearance and texture of the metal enclosure.

The present invention further provides a production method for the foregoing metal enclosure, and the production method includes the following steps:

cutting the housing to form at least one gap, where the at least one gap divides the housing into at least two electrically insulated parts;

filling each gap with an insulation object; and forming an insulation film on a surface of the housing.

In a specific production method, the forming an insulation film on a surface of the housing is specifically:

forming a metal film on the surface of the housing; and converting the metal film into a metal oxide film by means of anodic oxidation.

In an option, the method further includes: forming a reflective film between the housing and the insulation film, where the reflective film covers the entire surface of the housing.

In an option, the method further includes: forming a reflective film between the housing and the insulation film, where the reflective film covers a surface of the at least one gap, and when two or more gaps are formed on the housing by means of cutting, the reflective film further covers an area between neighboring gaps in the two or more gaps.

In another specific production method, the method further includes: providing a groove on the surface of the housing, where the at least one gap is provided on a bottom wall of the groove.

In an option, the method further includes: depositing, in the groove, filler of a same material as the housing, where a cavity of the groove is filled with the filler; and performing anodic oxidation processing on the housing, to form a metal oxide film on the surface of the housing.

In an option, the method further includes: laying, in the groove, a reflective film covering the bottom wall of the groove.

The present invention further provides a mobile device. The mobile device includes a device body and the metal enclosure according to any one of the foregoing implementations that is fixedly connected to the device body, and further includes an antenna disposed on the device body. At least one of at least two electrically insulated parts in the metal enclosure is used as a radiating element of the antenna. The metal enclosure of the mobile device has an integrated appearance, and in addition, the mobile device has fine communications performance.

BRIEF DESCRIPTION OF DRAWINGS

FIG. 2.1 to FIG. 2.6 are a processing flowchart of producing a metal enclosure with a structure shown in FIG. 2;

FIG. 2.7 to FIG. 2.13 are another processing flowchart of producing a metal enclosure with a structure shown in FIG. 2;

FIG. 3.1 to FIG. 3.7 are a processing flowchart of producing a metal enclosure with a structure shown in FIG. 3;

FIG. 4 is a cross sectional view of a metal enclosure in Embodiment 3 at a location perpendicular to a gap;

FIG. 4.1 to FIG. 4.7 are a processing flowchart of producing a metal enclosure with a structure shown in FIG. 4;

FIG. 5 is a cross sectional view of a metal enclosure in Embodiment 4 at a location perpendicular to a gap; and FIG. 5.1 to FIG. 5.8 are a processing flowchart of producing a metal enclosure with a structure shown in FIG. 5.

REFERENCE NUMERALS

1: Housing; 2: Plastic reinforcement layer; 3: Gap; 4: Insulation object; 5: Insulation film; 6: Reflective film; 7: Metal film

DESCRIPTION OF EMBODIMENTS

To make the objectives, technical solutions, and advantages of the present invention clearer, the following further describes the present invention in detail with reference to the accompanying drawings. Apparently, the described embodiments are merely a part rather than all of the embodiments of the present invention. All other embodiments obtained by persons of ordinary skill in the art based on the embodiments of the present invention without creative efforts shall fall within the protection scope of the present invention.

Embodiment 1

Figure 1:
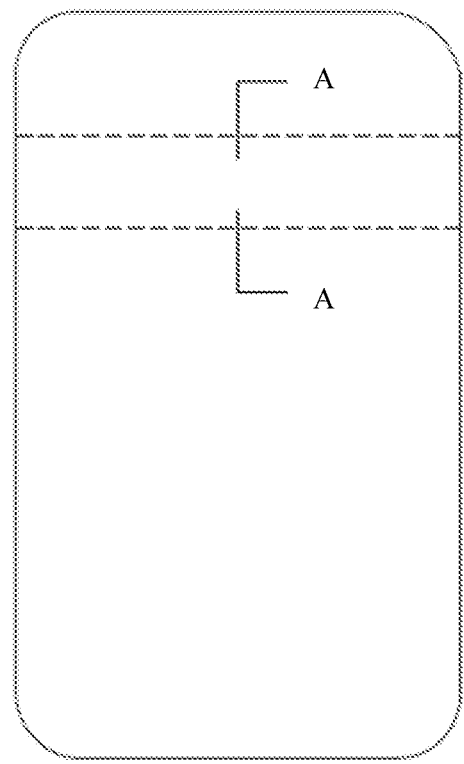
FIG. 1 is a diagram of an integrated appearance of a metal enclosure in Embodiment 1.
Figure 2:
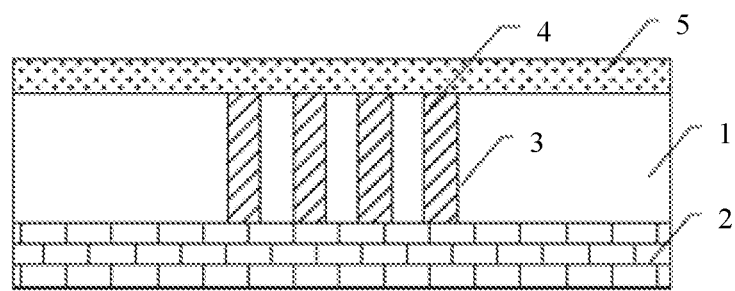
FIG. 2 is a cross sectional view of FIG. 1 at A-A.

As shown in FIG. 1 and FIG. 2, FIG. 1 is a diagram of an integrated appearance of a metal enclosure provided in this embodiment of the present invention, and FIG. 2 is a cross sectional view of FIG. 1 at A-A.

Embodiment 1 of the present invention provides a metal enclosure. The metal enclosure includes a housing 1. At least one gap 3 is provided on the housing 1, the at least one gap 3 divides the housing 1 into at least two electrically insulated parts, and each gap 3 is filled with an insulation object 4. The metal enclosure further includes an insulation film 5 attached to a surface of the housing 1.

An integrated metal enclosure generates electromagnetic shielding, electromagnetic wave transmission is blocked, and a communications function of an electronic device is accordingly affected. Therefore, in the foregoing embodiment, the gap 3 is provided on the housing 1, the gap 3 divides the housing 1 into the at least two electrically insulated parts, each gap is filled with the insulation object 4, and the divided parts of the housing 1 are spliced into a whole by using the insulation object 4. In a specific embodiment, the insulation object 4 is epoxy resin, a silicone sealant, or the like. In this way, the gap 3 and the insulation object 4 form a partition on the housing 1, so that impact exerted on electromagnetic wave transmission by electromagnetic shielding generated by the housing 1 is avoided, and a communications function of a mobile device is ensured. A width of the gap 3 falls within a range from 0.01 mm to 2.0 mm, such as 0.01 mm, 0.05 mm, 0.1 mm, 0.3 mm, 0.5 mm, 1.0 mm, or 2.0 mm. In addition, in a specific disposition, the gap 3 is specifically provided in a manner shown in FIG. 1. A length direction of the gap 3 is perpendicular to a length direction of the housing 1. That is, the gap 3 is horizontally arranged on the housing 1.

In addition, the insulation film 5 is further attached to the surface of the housing 1, and a thickness of the insulation film 5 falls within a range from 0.003 mm to 0.1 mm, such as 0.01 mm, 0.03 mm, 0.05 mm, or 0.08 mm. The insulation film 5 enables the partition that is on the housing 1 and that is formed by the gap 3 and the insulation object 4 to be invisible in appearance, so that the metal enclosure has an integrated appearance. In a specific embodiment, the insulation film 5 is a metal oxide film. The metal oxide film enables the metal enclosure to have metallic luster while ensuring that the metal enclosure has an integrated appearance, so that texture of the metal enclosure is improved.

In a specific embodiment, the metal enclosure includes a housing 1. A plastic reinforcement layer 2 is fastened to a cavity of the housing 1. Four gaps 3 are provided on a surface of the housing 1, a width of the gap 3 is 0.05 mm, and a spacing between the gaps is 0.8 mm. Each gap is filled with an insulation object 4 such as epoxy resin or a silicone sealant. In addition, an insulation film 5 is further attached to the surface of the housing 1, and a thickness of the insulation film 5 is 0.02 mm. Because of limitation of a production technology, there is an error of 0.01 mm for the thickness of the insulation film 5, and therefore, the thickness of the insulation film 5 ranges from 0.02−0.01 mm to 0.02+0.01 mm. During production of the metal enclosure in the foregoing embodiment, the following steps are included.

Step 1: As shown in FIG. 2.1, produce a housing 1 by using a metal formation technology such as die casting, stamping, forging, or CNC computer numerical control machining.

Step 2: As shown in FIG. 2.2, form a plastic reinforcement layer 2 in a cavity of the housing 1 by using a metal-plastic combination technology such as nano injection molding, in-film injection molding, glue adhering, hot melting, or ultrasonic welding. The plastic reinforcement layer 2 increases strength of the housing 1, and further improves a cavity structure of the housing 1.

Step 3: As shown in FIG. 2.3, cut the housing 1 to form at least one gap 3. The at least one gap 3 divides the housing 1 into at least two electrically insulated parts. Specifically, the housing 1 is cut to form four gaps 3 whose widths are 0.05 mm, a spacing between the gaps 3 is 0.8 mm, and the four gaps 3 are arranged on the housing 1 in parallel.

Step 4: As shown in FIG. 2.4, fill each gap 3 with an insulation object 4. Specifically, each gap 3 is filled with the insulation object 4 such as epoxy resin or a silicone sealant, and after the insulation object 4 is solidified, a surface of the housing 1 is smoothed, polished, and cleaned. In this way, the gaps 3 and the insulation object 4 form four partitions on the housing 1, so that impact exerted on electromagnetic wave transmission by electromagnetic shielding generated by the housing 1 is avoided.

Step 5: As shown in FIG. 2.5 and FIG. 2.6, form an insulation film 5 on the surface of the housing 1. Specifically, an insulation film 5 whose thickness is 0.02+/−0.01 mm is formed on the surface of the housing 1. The insulation film 5 enables the four partitions on the housing 1 that are formed by the gaps 3 and the insulation object 4 to be invisible in appearance, so that the metal enclosure has an integrated appearance.

During specific production of the insulation film 5, as shown in FIG. 2.5, a metal film 7 is first formed on the surface of the housing 1, and a thickness of the metal film 7 is 0.02+/−0.005 mm; and then, as shown in FIG. 2.6, the metal film 7 is converted into a metal oxide film by means of anodic oxidation. In an anodic oxidation process, a color of an obtained metal oxide film layer may further be adjusted by means of electrolytic coloring. The metal oxide film enables the metal enclosure to have metallic luster while ensuring that the metal enclosure has an integrated appearance. In addition, coloring may be performed as needed, so that texture of the metal enclosure is improved.

In a specific embodiment, an aluminum film is plated on the surface of the housing 1 usually by using a technology such as PVD (physical vapor deposition), CVD (chemical vapor deposition), ion plating, physical ejecting, or electroplating, and aluminum is converted into aluminum oxide by means of anodic oxidation, and is attached to the surface of the housing 1. The aluminum oxide has advantages such as high hardness and fine abrasion resistance, so that the texture of the metal enclosure is improved.

Alternatively, the metal enclosure in the foregoing embodiment may be produced by using the following production method, and the following steps are specifically included.

Step 1: As shown in FIG. 2.7, produce a housing 1 by using a metal formation technology such as die casting, stamping, forging, or CNC computer numerical control machining.

Step 2: As shown in FIG. 2.8, form a plastic reinforcement layer 2 in a cavity of the housing 1 by using a metal-plastic combination technology such as nano injection molding, in-film injection molding, glue adhering, hot melting, or ultrasonic welding, and the plastic reinforcement layer 2 increases strength of the housing 1, and further improves a cavity structure of the housing 1.

Step 3: As shown in FIG. 2.9, provide a groove on a surface of the housing 1.

Specifically, the groove is provided on the surface of the housing 1, a width of the groove matches a width, a spacing, and a quantity of a gap 3 provided in step 4, and a depth of the groove matches a thickness of filler disposed in step 6.

In this embodiment, the width of the groove is 2.6 mm, and the depth of the groove is 0.02 mm.

Step 4: As shown in FIG. 2.10, cut a bottom wall of the groove to form at least one gap 3. The at least one gap 3 divides the housing 1 into at least two electrically insulated parts. Specifically, the bottom wall of the groove is cut to form four gaps 3 whose widths are 0.05 mm, a spacing between the gaps 3 is 0.8 mm, and the four gaps 3 are arranged in parallel.

Step 5: As shown in FIG. 2.11, fill each gap 3 with an insulation object 4. Specifically, each gap 3 is filled with the insulation object 4 such as epoxy resin or a silicone sealant, and after the insulation object 4 is solidified, the surface of the housing 1 is smoothed, polished, and cleaned. In this way, the gaps 3 and the insulation object 4 form four partitions on the housing 1, so that impact exerted on electromagnetic wave transmission by electromagnetic shielding generated by the housing 1 is avoided.

Step 6: As shown in FIG. 2.12, deposit, in the groove, filler of a same material as the housing 1. A cavity of the groove is filled with the filler. In a specific embodiment, the housing 1 is made of an aluminum material, and an aluminum layer is deposited in the groove by using a technology such as PVD, CVD, ion plating, physical ejecting, or electroplating.

Step 7: As shown in FIG. 2.13, form an insulation film 5 on the surface of the housing 1. Specifically, anodic oxidation processing is performed on the housing 1, to form a metal oxide film on the surface of the housing 1. In an anodic oxidation process, a color of an obtained metal oxide film layer may further be adjusted by means of electrolytic coloring. The metal oxide film enables the metal enclosure to have metallic luster while ensuring that the metal enclosure has an integrated appearance. In addition, coloring may be performed as needed, so that texture of the metal enclosure is improved.

When the housing 1 is made of an aluminum material, an aluminum oxide film is formed on the surface of the housing 1 by using an anodic oxidation technology. Aluminum oxide has advantages such as high hardness and fine abrasion resistance, so that the texture of the metal enclosure is improved.

Embodiment 2

Figure 3:
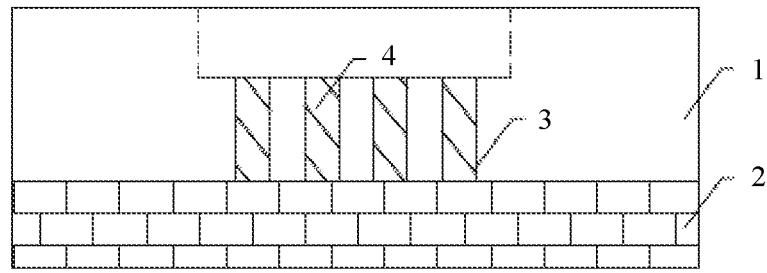
FIG. 3 is a cross sectional view of a metal enclosure in Embodiment 2 at a location perpendicular to a gap.
Figure 3:
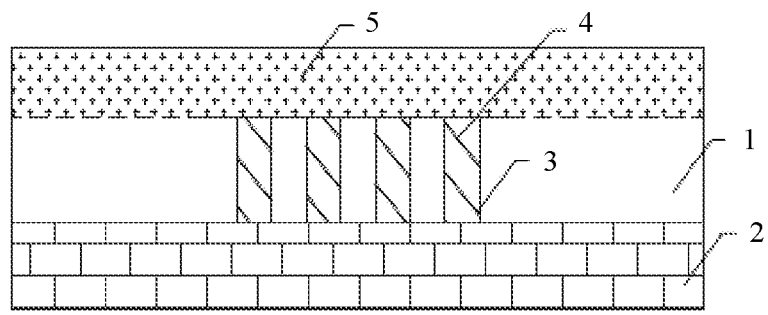
Figure 3:
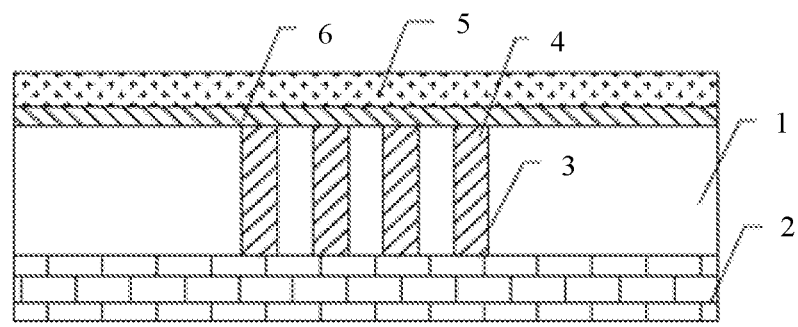

As shown in FIG. 3, FIG. 3 is a cross sectional view of a metal enclosure provided in this embodiment of the present invention at a location perpendicular to a gap.

This embodiment of the present invention provides a metal enclosure. The metal enclosure includes the housing 1, the gap 3, the insulation object 4, and the insulation film 5 in Embodiment 1, all the foregoing structures are the same as the structures and the dispositions in Embodiment 1, and details are not described herein again. A difference between the metal enclosure provided in this embodiment and the metal enclosure in Embodiment 1 is that the metal enclosure provided in this embodiment further includes a reflective film 6. The reflective film 6 is specifically disposed between the housing 1 and the insulation film 5, and covers an entire surface of the housing 1.

The reflective film 6 may provide a reflective rate approximate to that of metal of the housing 1, so that a partition that is on the surface of the housing 1 and that is formed by the gap 3 and the insulation object 4 has no obvious brightness difference in appearance from the housing 1. Specifically, the reflective film 6 is an imitated metal coating, or the reflective film 6 is made from indium, tin, or an indium-tin alloy by means of deposition.

In a specific embodiment, the metal enclosure includes a housing 1. A plastic reinforcement layer 2 is fastened to a cavity of the housing 1. Four gaps 3 are provided on a surface of the housing 1, a width of the gap 3 is 0.1 mm, and a spacing between the gaps is 0.8 mm. Each gap is filled with an insulation object 4 such as epoxy resin or a silicone sealant. An insulation film 5 is further attached to the surface of the housing 1, and a thickness of the insulation film 5 is 0.03 mm. Because of limitation of a production technology, there is an error of 0.01 mm for the thickness of the insulation film 5, and therefore, the thickness of the insulation film 5 ranges from 0.03-0.01 mm to 0.03+0.01 mm. In addition, a reflective film 6 is further included, the reflective film 6 is between the housing 1 and the insulation film 5, and the reflective film 6 covers the entire surface of the housing 1. During production of the metal enclosure in the foregoing embodiment, the following steps are included.

As shown in FIG. 3.1 to FIG. 3.4, step 1, step 2, step 3, and step 4 in a production method provided in this embodiment is the same as step 1, step 2, step 3, and step 4 in Embodiment 1 shown in FIG. 2.1 to FIG. 2.4, and details are not described herein again. The production method provided in this embodiment further includes the following steps.

Step 5: As shown in FIG. 3.5, form a reflective film 6 on the surface of the housing 1. Specifically, a reflective film 6 with a thickness at a nanometer level is formed on the surface of the housing 1, and the reflective film 6 covers the entire surface of the housing 1. The reflective film 6 may provide a reflective rate approximate to that of metal of the housing 1, so that the four partitions on the housing 1 that are formed by the gaps 3 and the insulation object 4 have no obvious brightness difference in appearance from the housing 1. Specifically, the reflective film 6 is an imitated metal coating, or the reflective film 6 is made from indium, tin, or an indium-tin alloy by means of deposition.

Step 6: As shown in FIG. 3.6 and FIG. 3.7, form an insulation film 5 on the surface of the housing 1. Specifically, an insulation film 5 whose thickness is 0.03+/−0.01 mm is formed on the reflective film 6. The insulation film 5 enables the four partitions on the housing 1 that are formed by the gaps 3 and the insulation object 4 to be invisible in appearance, so that the metal enclosure has an integrated appearance.

During specific production of the insulation film 5, as shown in FIG. 3.6, a metal film 7 is first formed on a surface of the reflective film 6, and a thickness of the metal film 7 is 0.03+/−0.005 mm; and then, as shown in FIG. 3.7, the metal film 7 is converted into a metal oxide film by means of anodic oxidation. In an anodic oxidation process, a color of an obtained metal oxide film layer may be adjusted by means of electrolytic coloring. The metal oxide film enables the metal enclosure to have metallic luster while ensuring that the metal enclosure has an integrated appearance. In addition, coloring may be performed as needed, so that texture of the metal enclosure is improved.

In a specific embodiment, an aluminum oxide film may be formed on the surface of the housing 1. A specific production method is the same as the method used for producing the aluminum oxide film in Embodiment 1, and details are not described herein again. The aluminum oxide has advantages such as high hardness and fine abrasion resistance, so that the texture of the metal enclosure is improved.

Embodiment 3

As shown in FIG. 4, FIG. 4 is a cross sectional view of a metal enclosure provided in this embodiment of the present invention at a location perpendicular to a gap.

This embodiment of the present invention provides a metal enclosure. A difference between the metal enclosure and the metal enclosure in Embodiment 2 lies only in that a reflective film 6 is disposed at a different location, other structures are the same, and details are not described herein again. In this embodiment, the reflective film 6 is between a housing 1 and an insulation film 5, and the reflective film 6 covers a surface of at least one gap 3. When two or more gaps 3 are formed on the housing 1 by means of cutting, the reflective film 6 further covers an area between neighboring gaps 3 in the two or more gaps 3.

In addition, the reflective film 6 provided in this embodiment has a same effect as the reflective film 6 in Embodiment 2, and both may provide a reflective rate approximate to that of metal of the housing 1, so that partitions on a surface of the housing 1 that are formed by the gaps 3 and the insulation object 4 have no obvious brightness difference in appearance from the housing 1. Specifically, the reflective film 6 is an imitated metal coating, or the reflective film 6 is made from indium, tin, or an indium-tin alloy by means of deposition.

In a specific embodiment, the metal enclosure includes a housing 1. A plastic reinforcement layer 2 is fastened to a cavity of the housing 1. Four gaps 3 are provided on a surface of the housing 1, a width of the gap 3 is 0.2 mm, and a spacing between the gaps is 0.8 mm. Each gap is filled with an insulation object 4 such as epoxy resin or a silicone sealant. An insulation film 5 is further attached to the surface of the housing 1, and a thickness of the insulation film 5 is 0.04 mm. Because of limitation of a production technology, there is an error of 0.01 mm for the thickness of the insulation film 5, and therefore, the thickness of the insulation film 5 ranges from 0.04-0.01 mm to 0.04+0.01 mm. In addition, a reflective film 6 is further included, the reflective film 6 is between the housing 1 and the insulation film 5, and the reflective film 6 covers surfaces of the four gaps 3 and covers an area between neighboring gaps 3 in the four gaps 3. During production of the metal enclosure in the foregoing embodiment, the following steps are included.

As shown in FIG. 4.1 to FIG. 4.4, step 1, step 2, step 3, and step 4 in a production method provided in this embodiment is the same as step 1, step 2, step 3, and step 4 in Embodiment 1 shown in FIG. 2.1 to FIG. 2.4, and details are not described herein again. The production method provided in this embodiment further includes the following steps.

Step 5: As shown in FIG. 4.5, form a reflective film 6 on the surface of the housing 1. Specifically, a reflective film 6 with a thickness at a nanometer level is formed on the surface of the housing 1, and the reflective film 6 covers surfaces of the four gaps 3 and an area between neighboring gaps 3 in the four gaps 3. The reflective film 6 may provide a reflective rate approximate to that of metal of the housing 1, so that the four partitions on the housing 1 that are formed by the gaps 3 and the insulation object 4 have no obvious brightness difference in appearance from the housing 1. Specifically, the reflective film 6 is an imitated metal coating, or the reflective film 6 is made from indium, tin, or an indium-tin alloy by means of deposition.

Step 6: As shown in FIG. 4.6 and FIG. 4.7, form an insulation film 5 on the surface of the housing 1. Specifically, an insulation film 5 whose thickness is 0.04+/−0.01 mm is formed on the surface of the housing 1, and the insulation film 5 covers an entire surface area of the housing 1. The insulation film 5 enables the four partitions on the housing 1 that are formed by the gaps 3 and the insulation object 4 to be invisible in appearance, so that the metal enclosure has an integrated appearance.

During specific production of the insulation film 5, as shown in FIG. 4.6, a metal film 7 is first formed on the surface of the housing 1 and a surface of the reflective film 6, and a thickness of the metal film 7 is 0.04+/−0.005 mm; and then, as shown in FIG. 4.7, the metal film 7 is converted into a metal oxide film by means of anodic oxidation. In an anodic oxidation process, a color of an obtained metal oxide film layer may be adjusted by means of electrolytic coloring. The metal oxide film enables the metal enclosure to have metallic luster while ensuring that the metal enclosure has an integrated appearance. In addition, coloring may be performed as needed, so that texture of the metal enclosure is improved.

In a specific embodiment, an aluminum oxide film may be formed on the surface of the housing 1. A specific production manner is the same as the method used for producing the aluminum oxide film in Embodiment 1, and details are not described herein again. The aluminum oxide has advantages such as high hardness and fine abrasion resistance, so that the texture of the metal enclosure is improved.

Embodiment 4

As shown in FIG. 5, FIG. 5 is a cross sectional view of a metal enclosure provided in this embodiment of the present invention at a location perpendicular to a gap.

This embodiment of the present invention provides a metal enclosure. A difference between the metal enclosure and the metal enclosure in Embodiment 3 lies only in that a groove is further provided on an area at which a gap 3 is provided. A reflective film 6 is disposed in the groove, that is, the groove is provided on a surface of a housing 1, the gap 3 is provided on a bottom wall of the groove, and the reflective film 6 covering the bottom wall of the groove is further in the groove.

In addition, the reflective film 6 provided in this embodiment has a same effect as the reflective film 6 in Embodiment 3, and both may provide a reflective rate approximate to that of metal of the housing 1, so that a partition that is on the surface of the housing and that is formed by the gap 3 and the insulation object 4 has no obvious brightness difference in appearance from the housing 1. Specifically, the reflective film 6 is an imitated metal coating, or the reflective film 6 is made from indium, tin, or an indium-tin alloy by means of deposition.

In a specific embodiment, the metal enclosure includes a housing 1. A plastic reinforcement layer 2 is fastened to a cavity of the housing 1. Four gaps 3 are provided on a surface of the housing 1, a width of the gap 3 is 0.3 mm, and a spacing between the gaps is 0.8 mm. Each gap is filled with an insulation object 4 such as epoxy resin or a silicone sealant. An insulation film 5 is further attached to the surface of the housing 1, and a thickness of the insulation film 5 is 0.05 mm. Because of limitation of a production technology, there is an error of 0.01 mm for the thickness of the insulation film 5, and therefore, the thickness of the insulation film 5 ranges from 0.05-0.01 mm to 0.05+0.01 mm. In addition, a groove on the surface of the housing 1 is further included, the gap 3 is provided on a bottom wall of the groove, and a reflective film 6 covering the bottom wall of the groove is further in the groove. During production of the metal enclosure in the foregoing embodiment, the following steps are included.

Step 1: As shown in FIG. 5.1, produce a housing 1 by using a metal formation technology such as die casting, stamping, forging, or CNC computer numerical control machining.

Step 2: As shown in FIG. 5.2, form a plastic reinforcement layer 2 in a cavity of the housing 1 by using a metal-plastic combination technology such as nano injection molding, in-film injection molding, glue adhering, hot melting, or ultrasonic welding. The plastic reinforcement layer 2 increases strength of the housing 1, and further improves a cavity structure of the housing 1.

Step 3: As shown in FIG. 5.3, provide a groove on a surface of the housing 1. Specifically, the groove is provided on the surface of the housing 1, a width of the groove matches a width, a spacing, and a quantity of a gap disposed in step 4, and a depth of the groove matches a thickness of filler disposed in step 7. In this embodiment, the width of the groove is 3.6 mm, and the depth of the groove is 0.05 mm.

Step 4: As shown in FIG. 5.4, cut a bottom wall of the groove to form at least one gap 3. The at least one gap 3 divides the housing 1 into at least two electrically insulated parts. Specifically, the bottom wall of the groove is cut to form four gaps 3 whose widths are 0.3 mm, a spacing between the gaps is 0.8 mm, and the four gaps 3 are arranged in parallel.

Step 5: As shown in FIG. 5.5, fill each gap 3 with an insulation object 4. Specifically, each gap 3 is filled with the insulation object 4 such as epoxy resin or a silicone sealant, and after the insulation object 4 is solidified, the surface of the housing 1 is smoothed, polished, and cleaned. The gaps 3 and the insulation object 4 form four partitions on the housing 1, so that impact exerted on electromagnetic wave transmission by electromagnetic shielding generated by the housing 1 is avoided.

Step 6: As shown in FIG. 5.6, lay a reflective film 6 in the groove. Specifically, a reflective film 6 with a thickness at a nanometer level is disposed in the groove, and the reflective film 6 covers the bottom wall of the groove. The reflective film 6 may provide a reflective rate approximate to that of metal of the housing 1, so that the gaps 3 have no obvious brightness difference in appearance. Specifically, the reflective film 6 is an imitated metal coating, or the reflective film 6 is made from indium, tin, or an indium-tin alloy by means of deposition.

Step 7: As shown in FIG. 5.7, deposit, in the groove, filler of a same material as the housing 1. A cavity of the groove is filled with the filler. In a specific embodiment, the housing 1 is made of an aluminum material, and an aluminum layer is deposited in the groove by using a technology such as PVD, CVD, ion plating, physical ejecting, or electroplating.

Step 8: As shown in FIG. 5.8, form an insulation film 5 on the surface of the housing 1. Specifically, anodic oxidation processing is performed on the housing 1, to form a metal oxide film on the surface of the housing 1. In an anodic oxidation process, a color of an obtained metal oxide film layer may be adjusted by means of electrolytic coloring. The metal oxide film enables the metal enclosure to have metallic luster while ensuring that the metal enclosure has an integrated appearance. In addition, coloring may be performed as needed, so that texture of the metal enclosure is improved.

When the housing 1 is made by using an aluminum material, an aluminum oxide film is formed on the surface of the housing 1 by means of anodic oxidation. Aluminum oxide has advantages such as high hardness and fine abrasion resistance, so that the texture of the metal enclosure is improved.

It can be learned from the foregoing description that the metal enclosures provided in Embodiment 1 to Embodiment 4 of the present invention include a housing 1. A gap 3 is provided on the housing 1, the gap 3 divides the housing 1 into at least two electrically insulated parts, each gap 3 is filled with an insulation object 4, and the divided parts of the housing 1 are spliced into a whole by using the insulation object 4. In this way, the gap 3 and the insulation object 4 form a partition on the housing 1, so that impact exerted on electromagnetic wave transmission by electromagnetic shielding generated by the housing 1 is avoided. An insulation film 5 is further attached to a surface of the housing 1, and the insulation film 5 enables the partition formed by the gap 3 and the insulation object 4 to be invisible in appearance, so that the metal enclosure has an integrated appearance.

The present invention further provides a production method for the metal enclosure in the foregoing embodiment, and the following steps are included.

Cut a housing 1 to form at least one gap 3. The at least one gap 3 divides the housing 1 into at least two electrically insulated parts.

Fill each gap 3 with an insulation object 4.

Form an insulation film 5 on a surface of the housing 1.

To enable the metal enclosure to have an integrated appearance and have metallic luster, a metal oxide film may be specifically formed on the surface of the housing 1. A metal enclosure with the structure shown in FIG. 2 is produced by using the two production methods in Embodiment 1. To improve texture of the metal enclosure, a reflective film 6 may be further laid between the housing 1 and the insulation film 5, and the reflective film 6 covers the entire surface of the housing 1. A metal enclosure with the structure in FIG. 3 is produced by using the production method in Embodiment 2. In addition, alternatively, the reflective film 6 may cover only an area that is on the housing 1 and at which the at least one gap 3 is formed by means of cutting. Specifically, the reflective film 6 covers a surface of the at least one gap 3, and when two or more gaps 3 are formed on the housing 1 by means of cutting, the reflective film 6 further covers an area between neighboring gaps 3 in the two or more gaps 3. A metal enclosure with the structure in FIG. 4 is produced by using the method in Embodiment 3.

In another specific production method, a groove may further be provided on the surface of the housing 1, the at least one gap 3 is provided on a bottom wall of the groove, and a reflective film 6 is laid on the bottom wall of the groove. A metal enclosure with the structure in FIG. 5 is produced by using the production method in Embodiment 4.

The present invention further provides a mobile device. The mobile device includes a device body and the metal enclosure according to any one of Embodiment 1 to Embodiment 4 that is fixedly connected to the device body, and further includes an antenna disposed on the device body. At least one of at least two electrically insulated parts in the metal enclosure is used as a radiating element of the antenna. For the metal enclosure of the mobile device, a gap 3 is provided on a housing 1, the gap 3 divides the housing 1 into at least two electrically insulated parts, and each gap 3 is filled with an insulation object 4. In this way, the gap 3 and the insulation object 4 form a partition on the housing 1, so that impact exerted on electromagnetic wave transmission by electromagnetic shielding generated by the housing 1 is avoided. An insulation film 5 is further attached to a surface of the housing 1, and the insulation film 5 enables the partition formed by the gap 3 and the insulation object 4 to be invisible in appearance, so that the metal enclosure has an integrated appearance.

Obviously, persons skilled in the art can make various modifications and variations to the present invention without departing from the spirit and scope of the present invention. The present invention is intended to cover these modifications and variations provided that they fall within the scope of protection defined by the following claims and their equivalent technologies.

What is claimed is:

1. A metal enclosure of a mobile device, comprising:
   a housing, wherein at least one gap is provided on the housing, the at least one gap divides the housing into at least two electrically insulated parts, and each gap is filled with an insulation object; and
   an insulation film attached to a surface of the housing;
   wherein the housing is made of an aluminum material, and the insulation film is an aluminum oxide film;
   wherein the metal enclosure further comprising a reflective film between the housing and the insulation film, wherein the reflective film covers a surface of the at least one gap, and when two or more gaps are provided on the housing, the reflective film further covers an area between neighboring gaps in the two or more gaps; and
   wherein the reflective film is made from indium, tin, or an indium-tin alloy by means of deposition.

2. The metal enclosure of a mobile device according to claim 1, wherein a width of each gap falls within a range from 0.01 mm to 2.0 mm.

3. The metal enclosure of a mobile device according to claim 1, wherein a thickness of the insulation film falls within a range from 0.003 mm to 0.10 mm.

4. The metal enclosure of a mobile device according to claim 1, further comprising a plastic reinforcement layer fastened to a cavity of the housing.

5. A production method for a metal enclosure of a mobile device, the metal enclosure comprising a housing and an insulation film attached to a surface of the housing, the method comprising:
   cutting the housing to form at least one gap, wherein the at least one gap divides the housing into at least two electrically insulated parts;
   filling each gap with an insulation object;
   forming the insulation film on the surface of the housing, comprising forming an aluminum film on the surface of the housing and converting the aluminum film into an aluminum oxide film by means of anodic oxidation; and
   forming a reflective film between the housing and the insulation film, wherein the reflective film covers a surface of the at least one gap, and when two or more gaps are formed on the housing by means of cutting, the reflective film further covers an area between neighboring gaps in the two or more gaps, and wherein the reflective film is made from indium, tin, or an indium-tin alloy by means of deposition.

6. A mobile device, comprising:
   a device body;
   a metal enclosure that is fixedly connected to the device body; and
   an antenna disposed on the device body, wherein at least one of at least two electrically insulated parts in the metal enclosure is used as a radiating element of the antenna;
   wherein the metal enclosure of a mobile device comprises:
   a housing, wherein at least one gap is provided on the housing, the at least one gap divides the housing into at least two electrically insulated parts, and each gap is filled with an insulation object; and
   an insulation film attached to a surface of the housing;

wherein the housing is made of an aluminum material, and the insulation film is an aluminum oxide film;

wherein the metal enclosure further comprising a reflective film between the housing and the insulation film, wherein the reflective film covers a surface of the at least one gap, and when two or more gaps are provided on the housing, the reflective film further covers an area between neighboring gaps in the two or more gaps; and wherein the reflective film is made from indium, tin, or an indium-tin alloy by means of deposition.

\* \* \* \* \*